(12) United States Patent
Steele et al.

(10) Patent No.: US 6,780,672 B2
(45) Date of Patent: Aug. 24, 2004

(54) MICRO ELETRO-MECHANICAL COMPONENT AND SYSTEM ARCHITECTURE

(75) Inventors: Daniel W. Steele, Clay, NY (US); Joseph L. Chovan, North Syracuse, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/182,422
(22) PCT Filed: Jan. 29, 2001
(86) PCT No.: PCT/US01/02760
§ 371 (c)(1), (2), (4) Date: Jul. 29, 2002
(87) PCT Pub. No.: WO01/56067
PCT Pub. Date: Aug. 2, 2001

(65) Prior Publication Data
US 2003/0022417 A1 Jan. 30, 2003

Related U.S. Application Data
(60) Provisional application No. 60/179,067, filed on Jan. 31, 2000.

(51) Int. Cl.[7] .......................... H01L 21/44; H01L 23/02
(52) U.S. Cl. ...................... 438/107; 438/106; 438/109; 257/686
(58) Field of Search ............................. 438/51, 55, 64, 438/107, 108, 109, 122, 106; 257/685, 686, 723, 731

(56) References Cited
U.S. PATENT DOCUMENTS

| | | | | |
|---|---|---|---|---|
| 5,014,419 A | * | 5/1991 | Cray et al. ..................... 29/830 |
| 5,380,681 A | * | 1/1995 | Hsu ............................. 438/109 |
| 5,432,999 A | * | 7/1995 | Capps et al. ................. 438/109 |
| 5,770,476 A | * | 6/1998 | Stone .......................... 438/106 |
| 5,869,891 A | * | 2/1999 | Rostoker et al. ............. 257/712 |
| 5,880,024 A | * | 3/1999 | Nakajima et al. ........... 438/669 |
| 5,908,304 A | * | 6/1999 | Oudart et al. ................ 438/109 |
| 5,963,795 A | * | 10/1999 | Schneider et al. ........... 438/122 |
| 5,973,392 A | * | 10/1999 | Senba et al. ................. 257/686 |
| 6,002,177 A | * | 12/1999 | Gaynes et al. .............. 257/774 |
| 6,020,629 A | * | 2/2000 | Farnworth et al. .......... 257/686 |
| 6,137,163 A | * | 10/2000 | Kim et al. ................... 257/686 |
| 6,188,127 B1 | * | 2/2001 | Senba et al. ................. 257/686 |

FOREIGN PATENT DOCUMENTS

EP  0708484 A1 * 4/1996 ......... H01L/25/065

OTHER PUBLICATIONS

Larcombe et al., "Implementing Heterogeneous Microsystems in a Three–Dimensional Packaging Technology", May 1995, IEEE Custom Integrated Cir. Conf., pp. 59–62.*
Butler et al., "Adapting Multichip Module Foundries for MEMS Packaging", Apr. 1998, IEEE International Conf. on Multichip Modules and High Density Packaging, pp. 106–111.*

* cited by examiner

*Primary Examiner*—Matthew Smith
*Assistant Examiner*—Lex H. Malsawma
(74) *Attorney, Agent, or Firm*—Duane Morris LLP (57) ABSTRACT

Micro electromechanical, MEM, components are created which include at least one integrated circuit die (110*p*). A cavity in the MEM component modules (300*a*, 300*e*) further allows for the flush mounted attachment of component modules when the component modules are stacked to create MEM system structures. Commonly positioned via holes within the component modules provide for communication among the dies (110*a*, 110*b*, 110*c*) on the stacked modules. In one embodiment of the invention, module layers are stacked in an alternating manner that further creates, within in the structure horizontal interlocking slots and vertical chambers. The interlocking slots can be used to join a plurality of structures together and the vertical chambers can be used to draw heat from the structure (400).

31 Claims, 10 Drawing Sheets

MICRO ELETRO-MECHANICAL COMPONENT AND SYSTEM ARCHITECTURE

This application claims the benefit of provisional No. 60/179,067 filed on Jan. 31, 2000.

FIELD OF THE INVENTION

The present invention relates to the field of integrated circuits. More specifically, this invention relates to fashioning high-density micro electro-mechanical(MEM) structures.

BACKGROUND OF THE INVENTION

Figure 1:
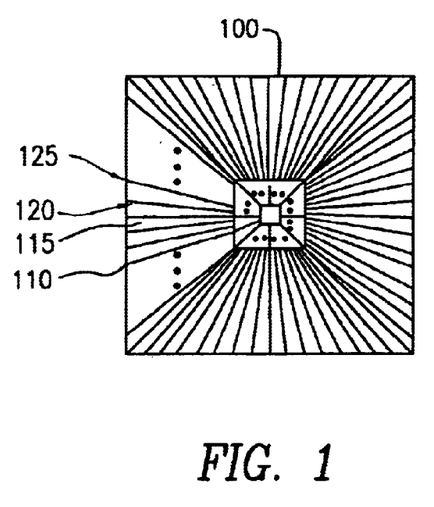
FIG. 1 illustrates a conventional integrated circuit interconnection wiring.

Integrated circuits, at the die level, exhibit extremely high electronic circuit density. Electronic components, such as transistors, capacitors, and resistive elements are fabricated in integrated circuit dies at sub-micron level, and achieve densities on the order of millions of components per square inch and billions of components per cubic inch. However, this high density is easily forfeited as the dies are typically placed in packages, which contain bulky wires bonded to the enclosed die and connected to pins on the package. The package is predominately composed of empty space. FIG. 1 illustrates a typical integrated circuit 100 configuration, in which wires 115, 120, 125, etc., provide signal communication paths to and from integrated circuit die 110.

Figure 2:
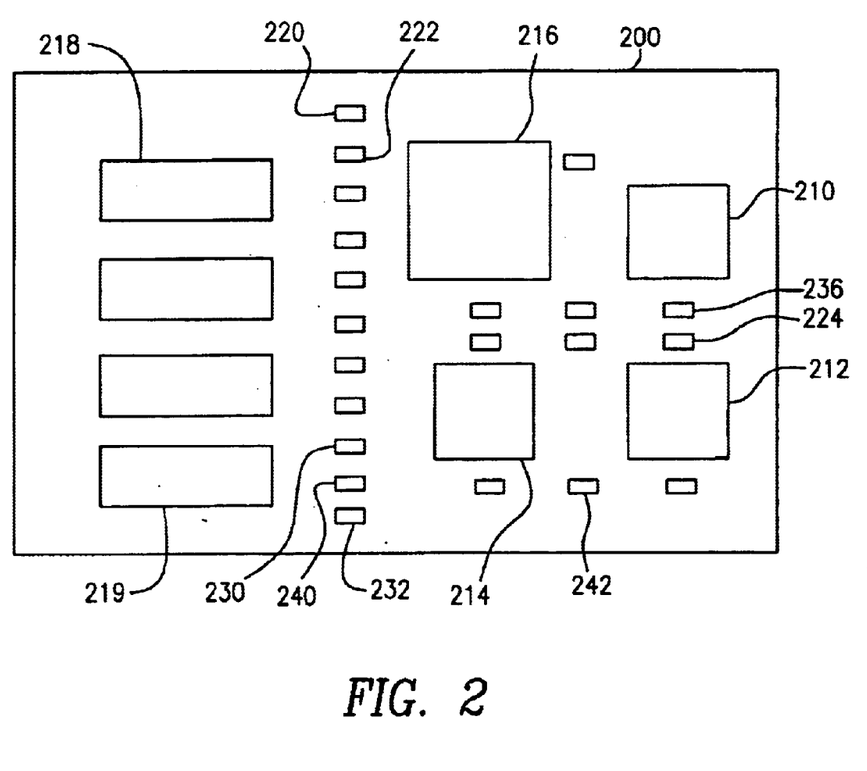
FIG. 2 illustrates a conventional printed circuit board containing integrated circuits and electrical components.

Packaged integrated circuits are further placed on a larger printed circuit board with most of the space occupied by pads that are used to connect the integrated circuits to the board. The packaged integrated circuits are further interconnected to achieve a desired functionality. As is known, the interconnections between integrated circuits introduce parasitic inductance and capacitance that effect the signals travelling between the integrated circuits. Accordingly, resistive, capacitive, and inductive devices are interposed in the interconnection paths to compensate for and reduce the level of introduced parasitic inductance and capacitance. FIG. 2 illustrates an exemplary printed circuit board (PCB) 200 containing a plurality of integrated circuits 210, 212, 218, 219, etc., coupling resistors 220, 222, etc., coupling capacitors 230, 232 etc., and coupling inductors 240, 242, etc.

Product package density is further reduced as multiple printed circuits boards are then electrically connected in racks, which, in turn, are housed in cabinets. Consequently, the resultant product density is considerably less than the achieved integrated circuit die density as the integrated circuit dies represent a negligible fraction of the overall product volume.

Thus, there is a need to develop structures of integrated circuit dies that achieve increased product packaging densities, reduce product dimensions and retain the benefits of high-density integrated circuit dies.

SUMMARY OF THE INVENTION

The present invention is associated with developing MEM component modules and using the MEM component modules to develop MEM structures that perform system level operations. MEM component modules are developed having a first surface and a second surface containing a plurality of via holes traversing the material from the first surface through to the second surface. The MEM component modules further include at least one integrated circuit die associated with said first surface and a cavity in the second surface in opposition to each of the at least one integrated circuit dies. The cavities are further sized substantially equal to a corresponding integrated circuit die. A MEM system level architecture comprises a plurality of MEM modules stacked vertically such that selective via holes in adjoining modules are in contact and provide at least one communication path between at least one first module and at least one vertically disposed module through via holes of intervening modules. Further, integrated circuit dies on one module are insertable into cavities of a module immediately disposed to provide a flush fit between stacked modules.

BRIEF DESCRIPTION OF THE DRAWINGS

In the drawings:

FIG. 3b illustrates a side view of an exemplary embodiment of the micro electro-mechanical component module illustrated in FIG. 3a;

FIG. 10b illustrates a side view of an exemplary embodiment of the micro electro-mechanical component illustrated in FIG. 10a.

It is to be understood that these drawings are solely for purposes of illustrating the concepts of the invention and are not intended as a definition of the limits of the invention. It will be appreciated that the same reference numerals, possibly supplemented with reference characters where appropriate, have been used throughout to identify corresponding parts.

DETAILED DESCRIPTION OF THE INVENTION

Figure 3A:
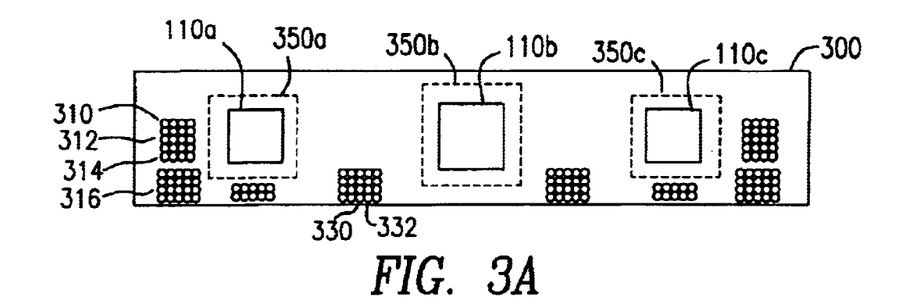
FIG. 3a illustrates a top view of an exemplary embodiment of a micro electro-mechanical (MEM) component module in accordance with the principles of the invention.

FIG. 3a illustrates a top view of an exemplary embodiment of a component module of the present invention. In this illustrated view, component module 300 includes three integrated circuit dies 110a, 110b, 110c. Integrated circuit dies 110a, 110b, 110c, as would be appreciated, can be fabricated onto a substrate material 305 using known fabrication methods and technology or can be fabricated external to substrate material 305 and then attached to substrate material 305 using known attachment methods, e.g., adhesive, solder, etc. Further illustrated are a plurality of "via" holes, 310, 312, 314, etc., which extend through, and are positioned along at least one edge of, material 305. Via holes 310, 312, 314, etc., provide conductive paths from a first surface, in this case, a top surface, to a second, bottom surface of material 305. Via holes can allow the passage of a conductor from a top surface to a bottom surface by plating, or filling, with a conductive material, e.g., metal, semiconductor, conductive gel, conductive epoxy, to allow passage of an electrical current from one surface to another.

Figure 3B:
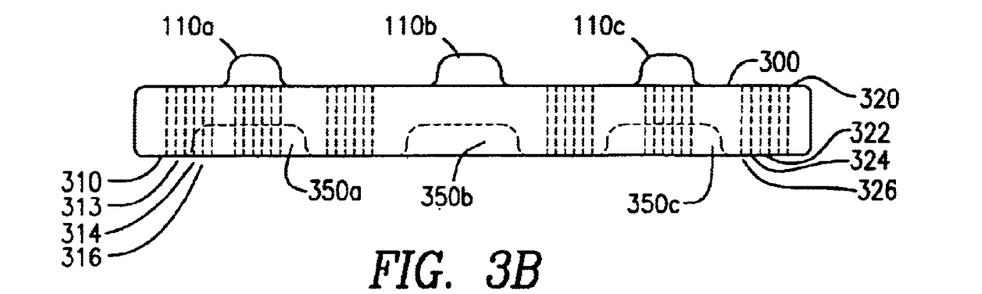

FIG. 3b depicts a side-view of the component module illustrated in FIG. 3a. In this illustrated example, three integrated circuit dies, i.e., dies 110a, 110b, 110c, are shown attached along a top surface of module 300. Via holes 310, 312, 314, etc., extend through material 305 from a first surface to a second surface. Illustrated also are cavities 350a, 350b, 350c, within the second surface. Cavities 350a, 350b, 350c correspond to the location of dies 110a, 110b, 110c on the first surface. Cavities 350a, 350b, 350c provide area or region to accommodate protrusions caused by dies 110a, 110b, 110c on the surface of substrate 300, in regard to the creation of MEM structures, as will be become evident.

Figure 3C:
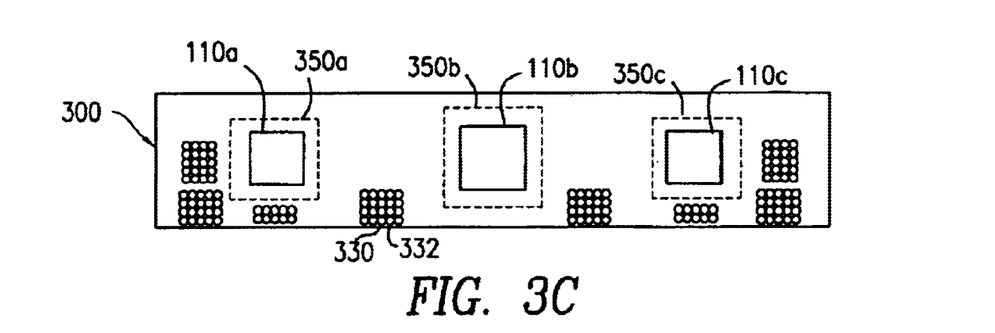
FIG. 3c illustrates a top view of a second exemplary embodiment of MEM component module in accordance with the principles of the invention.
Figure 3D:
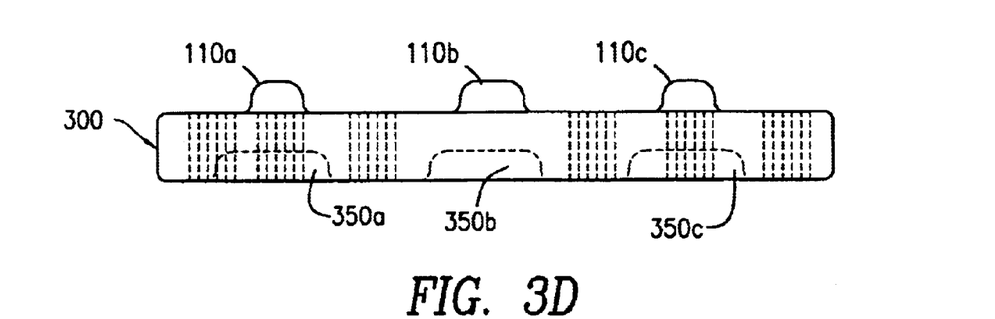
FIG. 3d illustrates a side view of an exemplary embodiment of the MEM component module illustrated in FIG. 3c.

FIGS. 3c and 3d illustrate a top view and a side view, respectively, of a second exemplary embodiment of the present invention. In this exemplary embodiment, cavities 350a, 35b, 350c, are depicted as extending outward to an edge of substrate 300. This extension of the cavity is advantageous to allow access to integrated circuit dies in MEM structures formed in accordance with the principles of the present invention. Although not shown, it would be appreciated, cavities 350a, 350b, 350c, can be extended from one edge of substrate 300 to a second edge. In this case, the cavities are formed as furrows or channels through material 305.

As would be appreciated, the integrated circuit dies associated with component module 300 may be selected from a plurality of different integrated circuit types. For example, integrated circuit dies may correspond to central processing units, arithmetic units, addressing units, random access memory (RAM), read-only memory (ROM) devices. Hence, component modules can include a mix of different integrated circuit types, or may include only a plurality of a single integrated circuit die. The combination of component modules having known integrated circuit types may thus be used as building blocks to form MEM architectures that achieve desired system operation.

Figure 4:
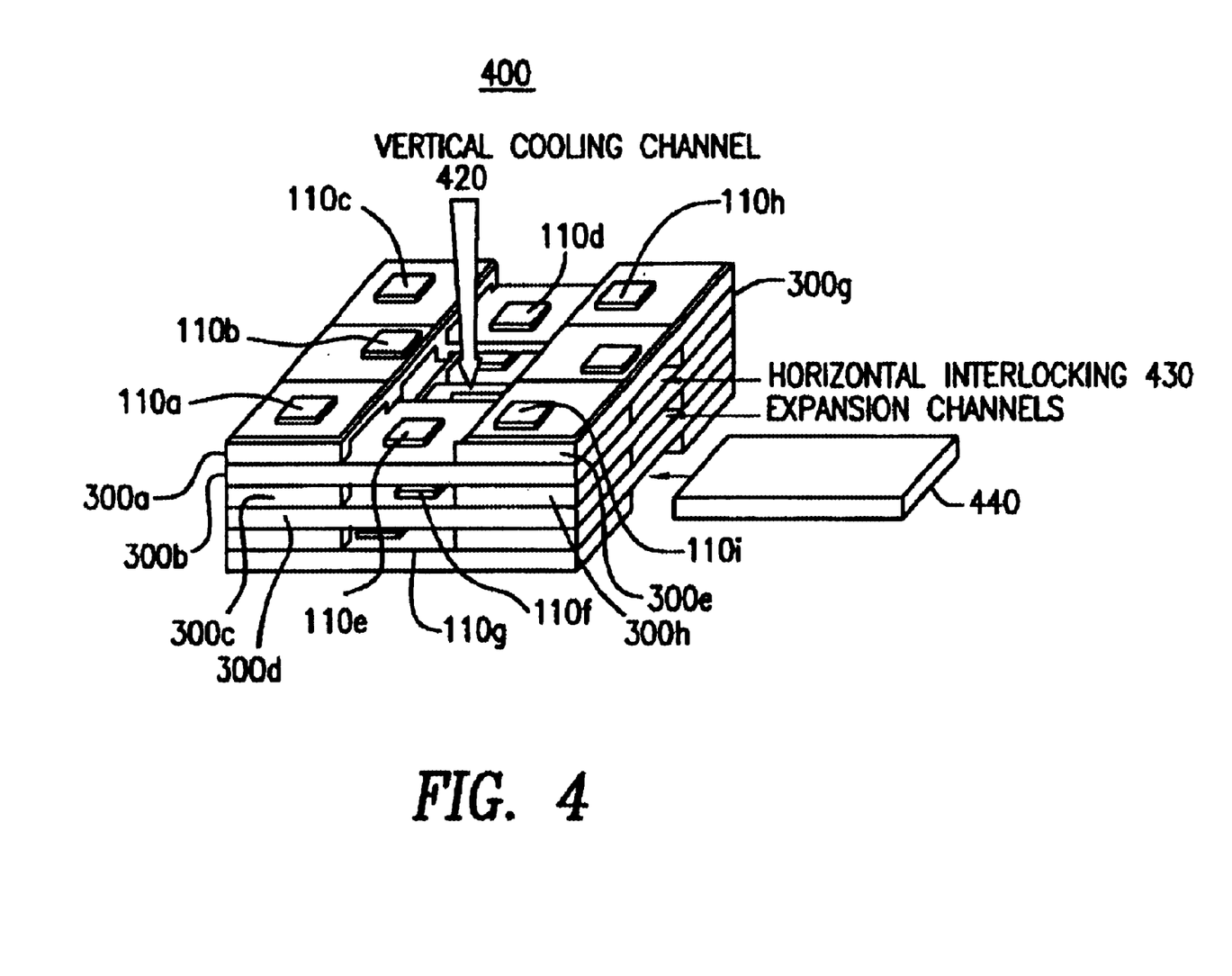
FIG. 4 illustrates a prospective view of an exemplary MEM structure in accordance with the principles of the invention.

FIG. 4 illustrates an exemplary MEM structure 400 formed, in a preferred embodiment of the present invention, by vertically stacking component modules, illustrated in FIG. 3a, in an alternating manner in six module layers. In this illustrative MEM structure, component modules 300a, 300e are representative of the top most layer. Modules 300b, 300g are representative of a next lower layer within structure 400 and are alternately oriented with respect to the immediately higher level. Modules 300c, 300h are representative of a still next lower layer within structure 400 and are alternately oriented with respect to the immediately higher level. This pattern of alternating modules or module layers continues for each of the remaining illustrated module layers in structure 400.

In this example, component modules within a layer are oriented in a parallel relation, i.e., module 300a is positioned parallel to module 300e, module 300b is positioned parallel to module 300g and module 300c is positioned parallel to module 300h. Further, module layers are alternately positioned orthogonally to an immediately adjoining layer. Module layer containing component modules 300a, 300e, thus is oriented orthogonally to the layer containing modules 300b, 300g. Similarly, the layer containing component modules 300c, 300h, is oriented orthogonally to the layer containing modules 300b, 300g. In this exemplary structure configuration, modules of one layer further provide a bridge between modules of an immediately adjoining module layer.

Although the component modules illustrated in FIGS. 3a–3d are shown associated with at least one integrated circuit die, it would be appreciated that each component module in structure 400 need not be associated with integrated circuit dies. Rather, component modules may merely provide a connectivity bridge from one module to another or provide structural support for a next superseding module.

The alternating disposition of the illustrated rectangular shaped component modules further creates horizontal openings 430 on alternating levels and vertical chamber 420 within structure 400. In this illustrative example of six module layers, three horizontal openings are illustrated within a front surface and a side surface of structure 400. Similar horizontal openings are created in the rear and side surfaces of structure 400, which are not viewable in this prospective illustration. Horizontal openings, referred herein as horizontal interlocking slot 430, enable access to at least one integrated circuit die, e.g., 110e, 110f, 110g on the illustrated front surface and 110d on a rear surface. Horizontal interlocking slot 430, further allows a means for connecting a first MEM structure to a second, similarly constructed, MEM structure (not shown), using expansion connectivity block 440. Although not shown, connectivity block 440 also contains via holes that may be used to transfer signals from a module in one layer to a module in a second layer or to exchange signals from one module in a first structure to another module in a second structure. Connectivity block 440 can also be used to provide input signals, such as from a keyboard, sensor, etc., into structure 400 or to output signal from structure 400 to a display, printer, etc.

Although, only a single expansion connectivity block 440 is illustrated herein, it would be appreciated, that an expansion connectivity block may be included in each of the horizontal interlocking slots that are formed in structure 400 to interconnect a plurality of MEM structures or provide input/output connectivity.

Vertical chamber 420 provides a means to draw heat from, and provide cooling to the integrated circuit dies and modules within the MEM structure 400. As is known, heat generation from integrated circuits is a significant problem. Heat sinks and attached cooling fans are typically used to draw heat and prevent overheating of packaged integrated circuits. Increasing the packaging density of integrated circuit dies thus requires methods of transferring heat away from the stacked integrated circuit dies, without increasing the size of the packaging. Vertical chamber 420, as will become evident, is representative of a chamber into which heat transfer devices may be inserted without increasing the overall MEM structural dimensions.

Figure 5:
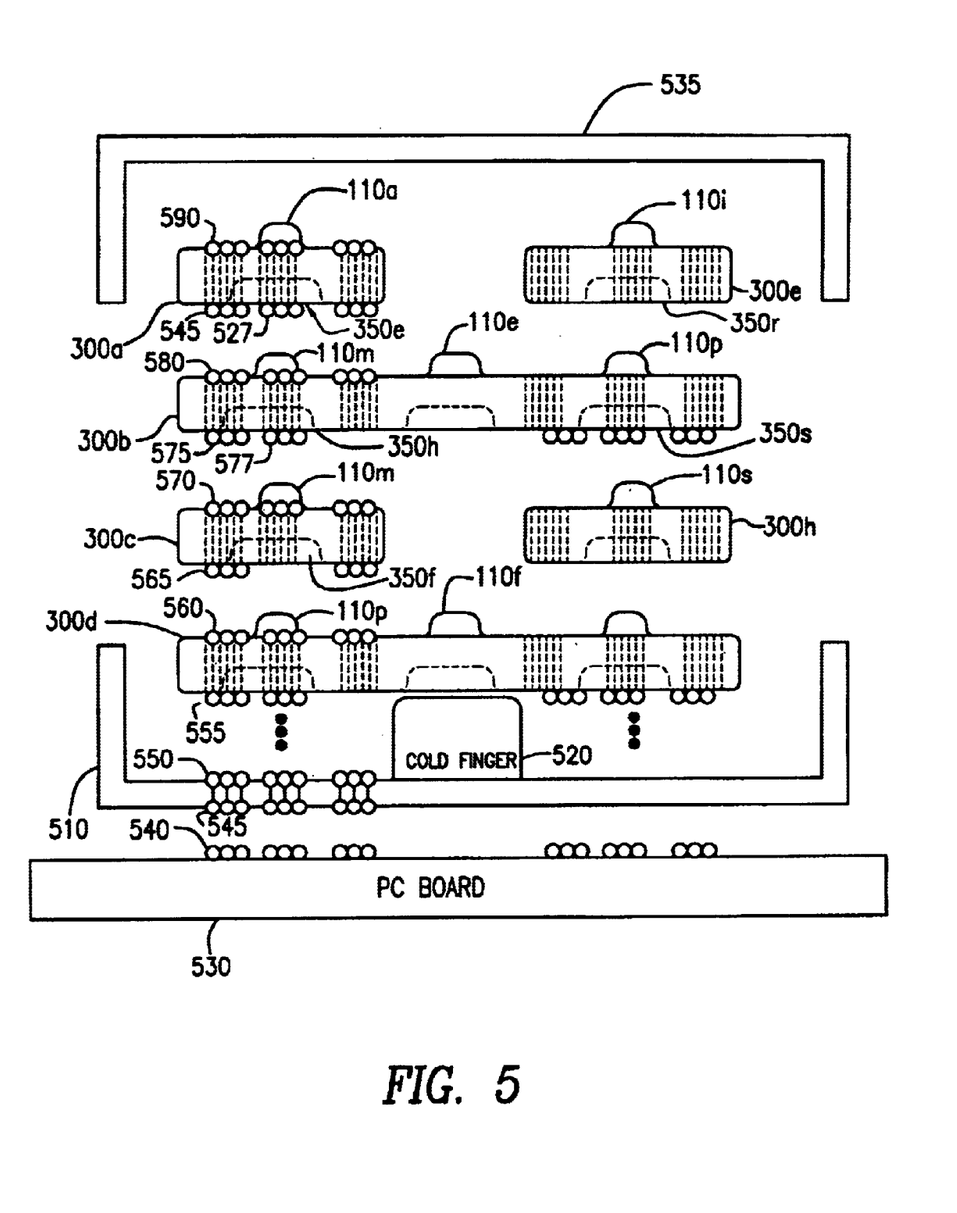
FIG. 5 illustrates a cross-sectional view of the exemplary MEM structure illustrated in FIG. 4.

FIG. 5 illustrates a cross-section of MEM structure 400 wherein the module layers are separated to illustrate the principles of the invention. In this illustration, component module 300a and 300e are shown oriented in a parallel relation and perpendicular to the cross-sectional plane. Modular 300b is positioned immediately below and oriented orthogonally to modules 300a and 300e. Component modules 300c and 300h comprise the layer immediately below module 300b and similar to component modules 300a and 300e, are oriented in a parallel relation and perpendicular to the cross-sectional plane. Component module 300d is positioned immediately below and orthogonal to modules 300c and 300h.

The separated view of stacked modules illustrates the interaction between cavities on one module and integrated circuit dies on a second, immediately adjoining, module. More specifically, cavity 350a within module 300 provides a space or area to accommodate integrated circuit die 110n on module 300b when module 300a is placed in contact with module 300b. Similarly, cavity 350e on module 300b provides a space or area to accommodate integrated circuit die 110m on module 300c and cavity 350f on module 300c provides a space to accommodate integrated circuit die 110p on module 300d, when modules are placed in contact with one another. It would be understood that integrated circuit die 110r on module 300b, similarly, engages cavity 350r within module 300e and integrated circuit die 110s on module 300h engages cavity 350h within module 300b, etc. Hence, the surfaces of the immediately adjoining modules of MEM structure 400 are in a flush mounted relation as protrusions in a top surface, caused by integrated circuit dies, fit within corresponding cavities within a bottom surface of an immediately adjoining module.

Flush mount relation of component modules is advantageous as flush mounting provides a means for aligning corresponding via holes of adjoining modules and, hence, continuous connectivity paths between corresponding via holes of adjoining modules and. For example, a continuous electrical path between a top layer module and a bottom layer module may be created by aligning corresponding via holes in each intervening component module. Modules may, further, be selectively connected to one another by appropriate termination of the connectivity paths of corresponding via holes. Matching corresponding via holes in the flush mounted stacked modules, accordingly, provide for flexible connectivity pathways among different modules. Although not shown, alignment cavities on a bottom surface and protrusions on a top of adjoining modules provides a representative means for aligning and interlocking modules.

To provide proper connectivity between via holes of immediately adjacent modules, via hole engagement means are necessary at selective via hole locations. In the illustrated example, via hole engagement means are shown as circular elements on the top and bottom surfaces of modules to illustrate those via holes which provide electrical connectivity paths. In this case, via hole engagement means 585 on a bottom surface of module 300a contact via hole engagement means 580 on top surface of module 300b to provide connectivity paths between these two modules and the integrated circuit dies associated with these two modules. As would be understood, where via hole engagement means are not present, the electrically connectivity of the accumulated via is terminated. Thus, integrated circuit die 110m on module 300c may not be in electrical contact with package 510 by selectively inhibiting electrically conductive via hole paths.

In one aspect of the invention, the engagement means can be pressed together to form electrical contact between corresponding layers. In another aspect of the invention, the illustrated engagement means may be attached using solder paste or electrically conductive adhesive. In still another aspect of the invention, the engagement means may be electrically conductive elements on the top and bottom surfaces of a module.

There is further shown in FIG. 5, cold-finger 520 within package 510. Cold finger 520, typically a metallic element, extends upward through vertical chamber 420 to provide a source of withdrawing heat from, or providing cooling to, MEM structure 400. Although not drawn to scale, it would be appreciated that cold finger 520 is of a size that occupies the vertical space of vertical chamber 420. Further, coldfinger 520 may also provide a means to position structure 400 within package 510. Although illustrated as a single unit, typically of metallic material, it would be understood that cold finger 520 can be also be a plurality of smaller fingers, which occupy the space of chamber 420.

Lid 535 may be optionally attached to package 510 to enclose and protect structure 400 from environmental conditions, such as moisture, for example.

Figure 6:
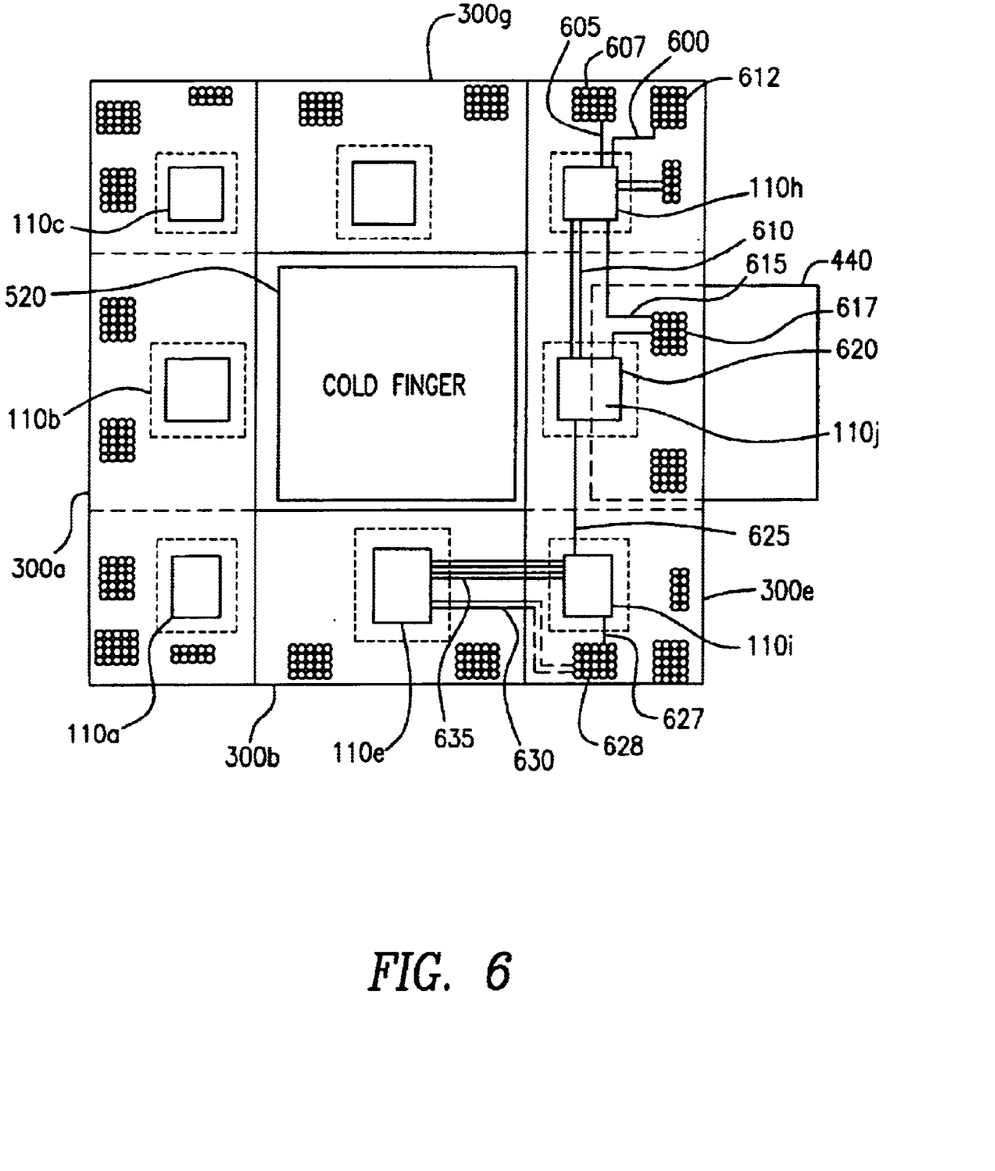
FIG. 6 illustrates a top view of the MEM structure illustrated in FIG. 4.

FIG. 6 depicts a top view of structure 400, illustrating integrated circuit interconnection in accordance with the principles of the present invention. In this exemplary illustration, cold finger 520 is depicted as substantially occupying vertical chamber 420 formed by joining illustrated modules 300a, 300b, 300e and 300g. For clarity, a limited number of interconnections are illustrated among the illustrated dies, e.g., dies 110e, 110i, 110j and 110h. In this example, die 110h is in electrical communication with die 110j through interconnection lines 610. Die 110h and 110j are associated with the same module, i.e. component module 300e, and, accordingly, direct interconnection between these integrated circuit dies is possible. Die 110h is also in communication with off-module elements through interconnection line 600a nd interconnection line 605. Interconnection line 600 is connected to via hole set 602 and interconnection line 605, which is connected to via hole set 607. As previously discussed, via hole set 602 may provide communication to components on a next lower lever, while via hole set 607 may provide communication to a different level or to P.C. board 530 (not shown). Die 110h is also shown in communication with an off-structure element through interconnection lines 615 and via hole set 617. In this case, connector 440 provides connectivity between die 110h and the, not shown, off-structure module.

Interconnection line 625 illustrates a communication path between integrated circuit die 110j and integrated circuit 110e, which are on the same component module. Integrated circuit die 110j is also shown in communication with offstructure elements through line 620 and via hole set 617. Integrated circuit die 110i is shown in communication with, off-module, integrated circuit die 110e. In this case, signals between the two dies are exchanged through interconnection line 627, via hole set 628 and interconnection line 630. Integrated circuit die 110e is also shown in communication with a non-viewable integrated circuit die through line 635. In this illustrated example, the integrated circuit die connected to integrated circuit die 110e is not visible because it is immediately beneath die 110i.

Figures 7A, 7B:
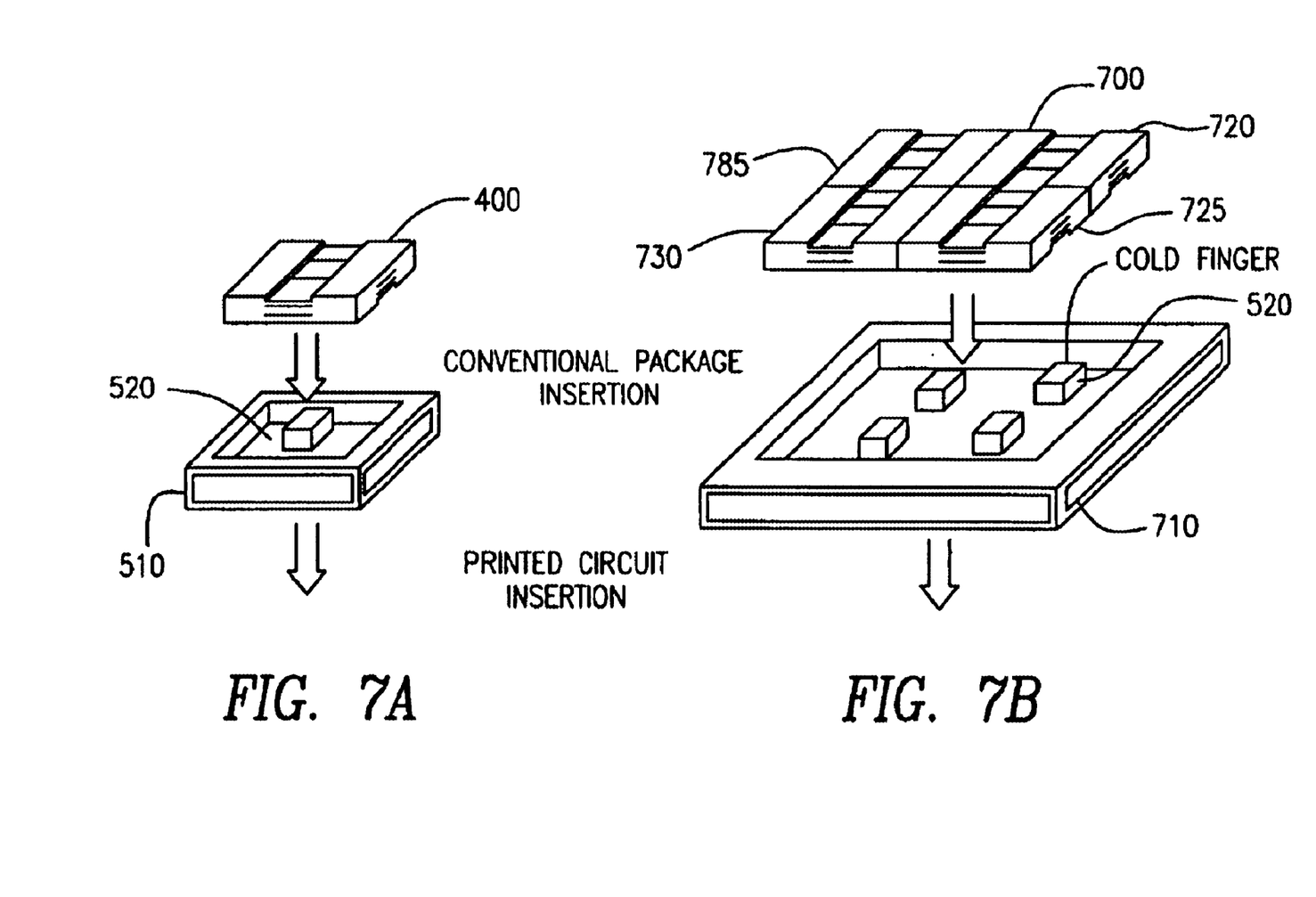
FIG. 7a illustrates a prospective view of the MEM structure illustrated in FIG. 4 engaging a heat transfer device in accordance with the principles of the invention.
FIG. 7b illustrates a prospective view of a plurality of MEM structures engaging a plurality of heat transfer devices in accordance with the principles of the invention.

FIG. 7a is a prospective drawing depicting structure 400 engaging cold finger 520 in package 510. FIG. 7b is a prospective drawing depicting a plurality of similarly constructed, interconnected, structures engaging a plurality of cold fingers in package 710. In this example, each interconnected structure may perform a known function or operation and the combined, interconnected, structure performs a complete system operation. For example, structure 720 may perform the function of a communication modem, structure 725 may perform the function of a central processing unit (CPU), structure 730 may perform the function of storage and structure 735 may perform the function of an input/output (I/O) device. Accordingly, inputs may be received on structure 735, processed by CPU structure 725, stored in structure 730 and transmitted over a communication network by structure 720.

Figure 8A:
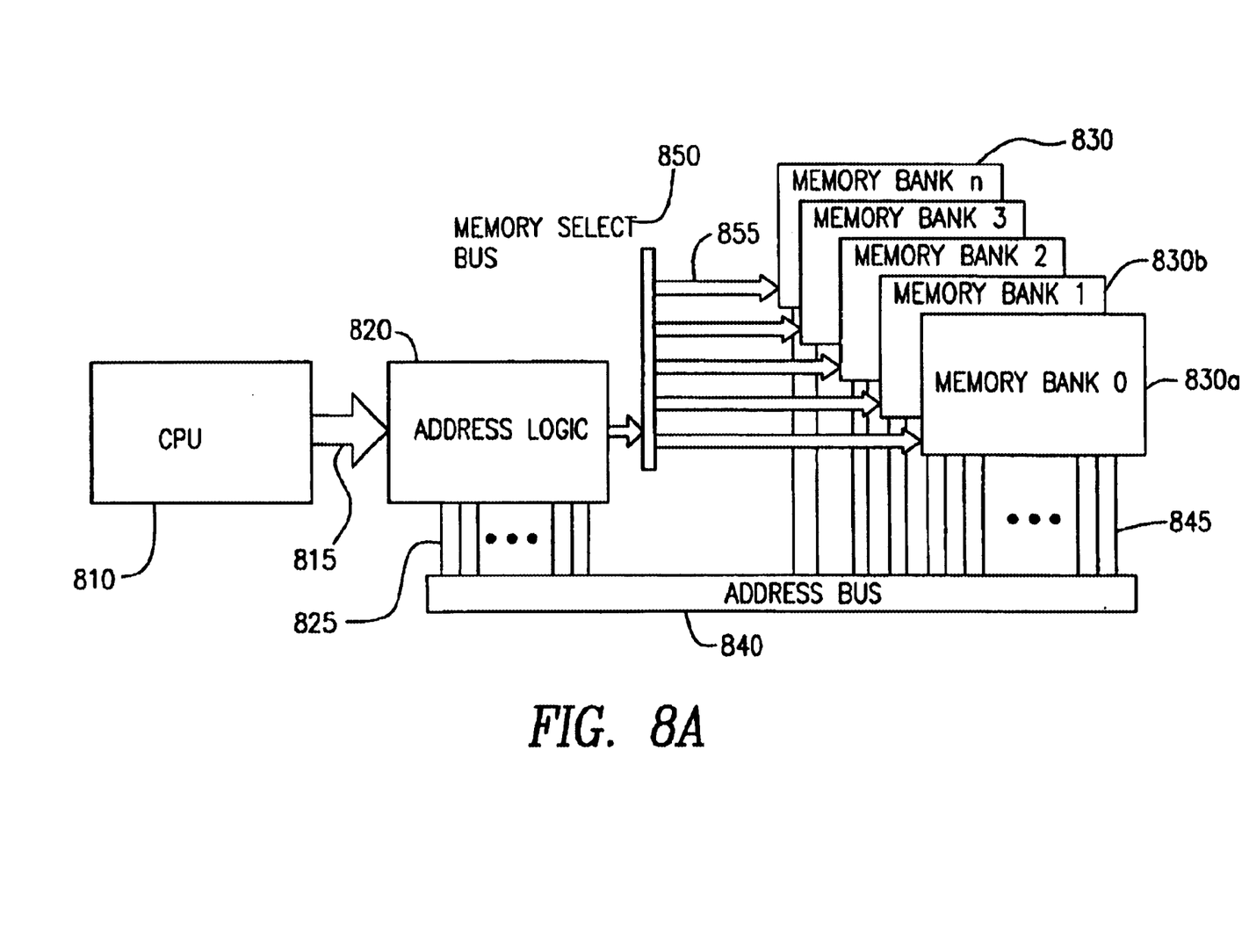
FIG. 8a illustrates a conventional block diagram of a computer system memory access.
Figure 8B:
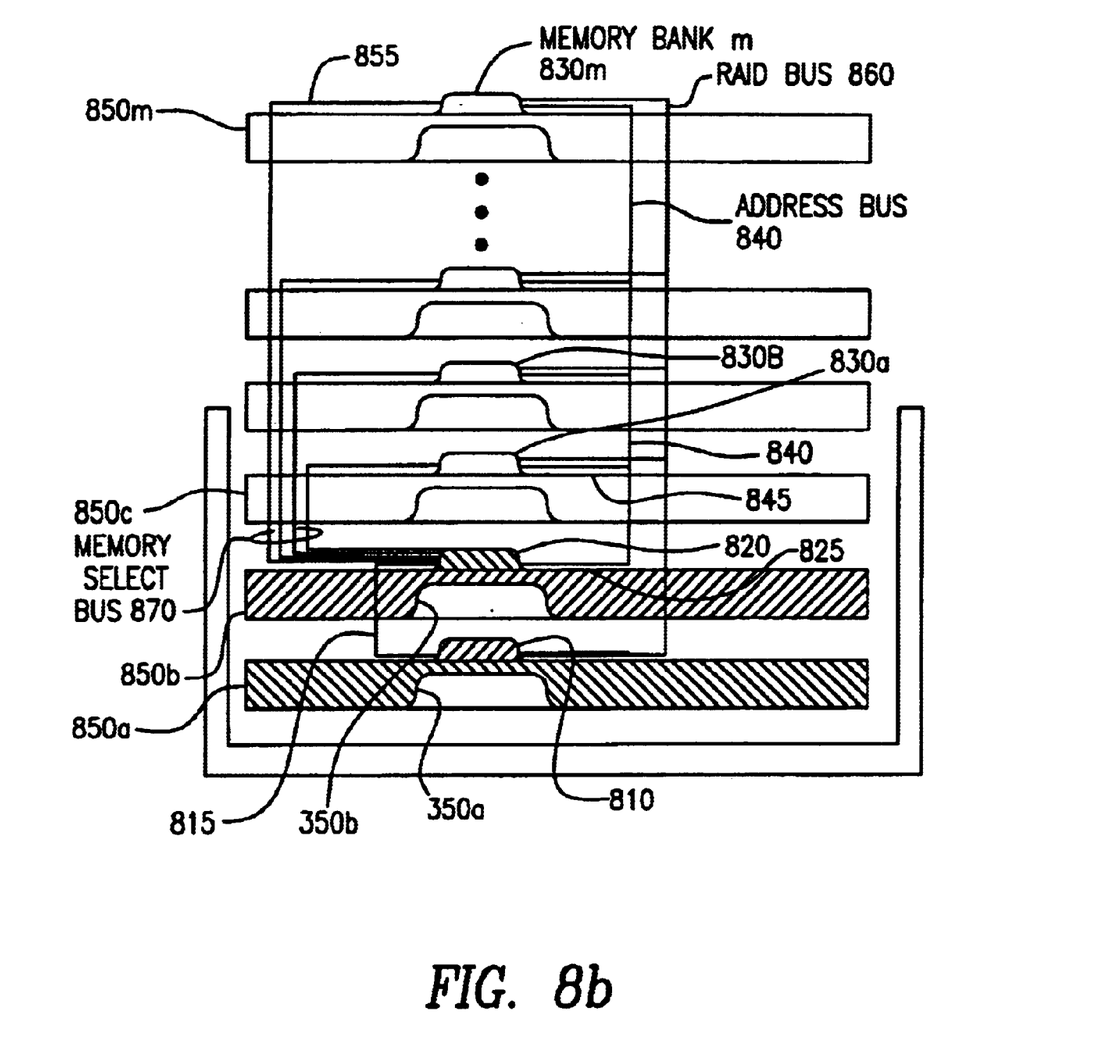
FIG. 8b illustrates a cross-sectional view of a MEM structure implementation of the system depicted in FIG. 8a in accordance with the principles of the invention.

FIG. 8a depicts of an exemplary computer configuration that may be constructed in accordance with the principles of the invention. FIG. 8b illustrates an exemplary MEM implementation of the system illustrated in FIG. 8a. In this example, component modules 850a–850n are shown separated to show the flexible via hole inter-module communication links. In this case, component module 850a is associated with integrated circuit dies which are representative of CPU 810 and component module 850b is associated with integrated circuit dies which are representative of address logic 820. Component modules 850c through 850n are associated with integrated circuit dies which are representative of memory bank 0, 830a through memory bank n, 830n. Also illustrated are cavities 350a and 350b in modules 850a and 850b, respectively, which depict an area to accommodate integrated circuit die on a lower module.

In this example, CPU die 810, on component module 850a, communicates with address logic die 820, through communication lines 815, which proceed along a top surface of module 850a, pass through via holes in module 850b and proceed along a top surface of module 850b to integrated circuit die 820. Similarly, address logic die 820 communicates with each memory bank module through communication lines 825 and address bus 840. Address bus 825 is representative of an electrical connectivity of via holes between each memory component module. Further, at each memory component module the address bus is connected to associated integrated circuit dies along communication lines, as represented by lines 845. Each module, thus, is accessible by the memory address access bus. Similarly, memory read bus 860 provides the contents of a selected memory address to CPU die 810.

Memory select bus 870 provides access control to selectively designated memory modules. In this illustrated case, address logic element 820 selects designated memory modules by selecting appropriate memory select lines. Memory select lines are designated for individual memory component modules by terminating connectivity of via holes at the selected module. Thus, the connectivity of via holes representative of memory select line associated with memory module 850c is terminated at module 850c, and that of memory module 850d is terminated at module 850d, etc.

Figure 9:
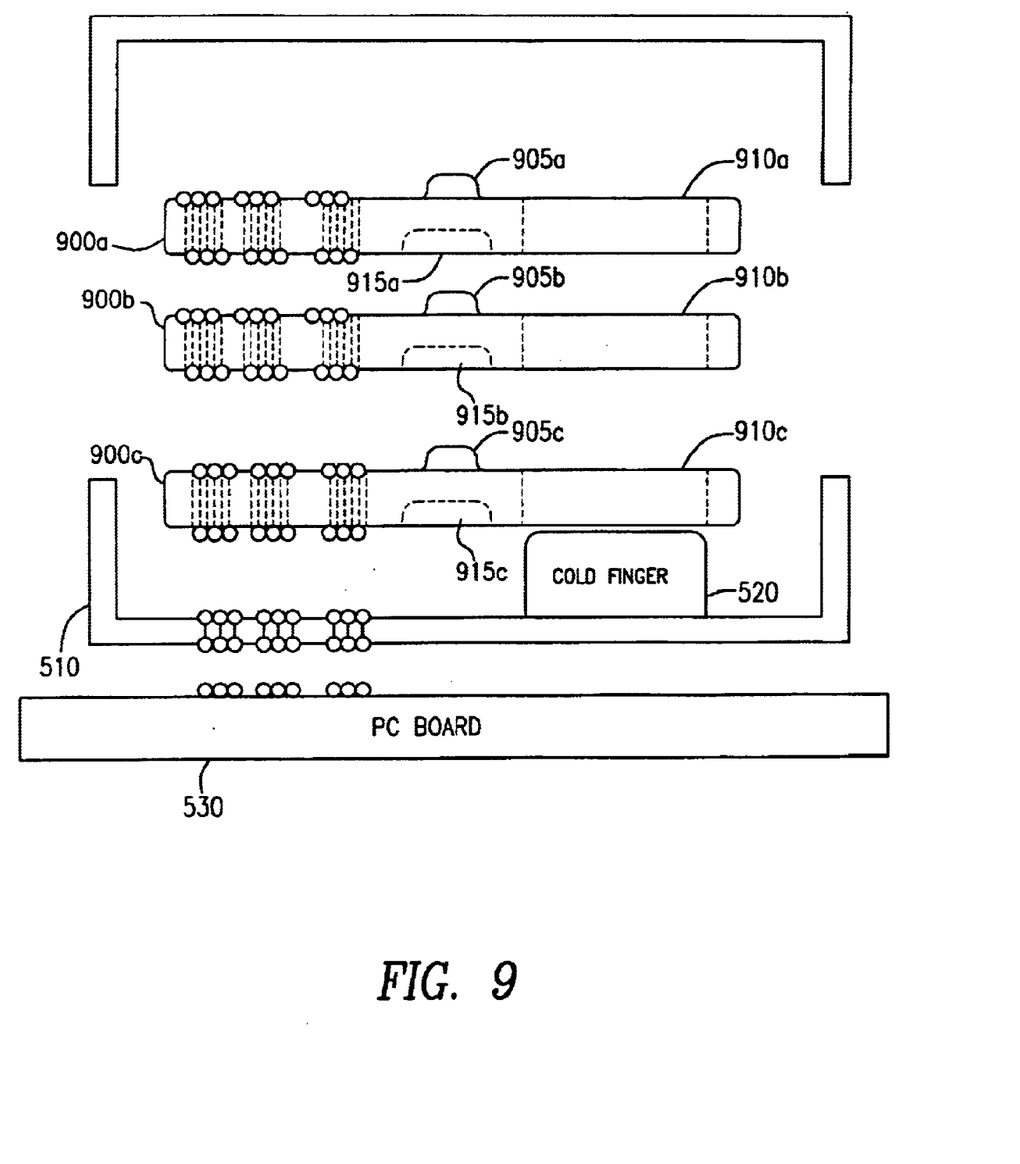
FIG. 9 illustrates a cross-sectional view of a second exemplary MEM component module in accordance with the principles of the invention.

FIG. 9 illustrates a second exemplary MEM structure in accordance with the principles of the invention. In this example, modules 900a, 900b and 900c are formed, in a square, circular or triangular shape and each contains, in this embodiment, a single integrated circuit die, i.e., dies 905a, 905b, 905c, respectively.

In this case, because each module is stacked immediately above a preceding module, a vertical cooling column is not formed within the MEM structure. Thus, at least one slot is created in each module to provide for the insertion of at least one cold finger insert 520. In this illustrative example, slots 910a, 910b, and 910c, are formed within module 900a, 900b and 900c respectively, to engage cold finger 520 to remove heat from the formed MEM structure.

Furthermore, the stacking and joining of modules using non-rectangular component shapes does not create horizontal interlocking slots, which, as discussed previously, are used to provide a connection means between structures. Accordingly to provide connection means between structures, interlocking blocks (not shown) may be included as one of the at least one stack layers. Thus, larger MEM system configurations may be developed using component modules of a non-rectangular shape in accordance with the principles of the invention.

Figure 10A:
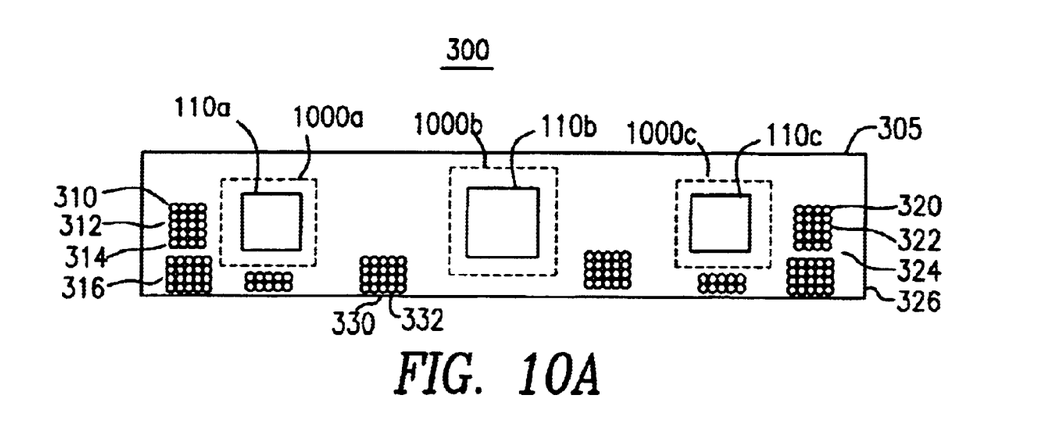
FIG. 10a illustrates a top view of another exemplary embodiment of a MEM component module in accordance with the principles of the invention.
Figure 10B:
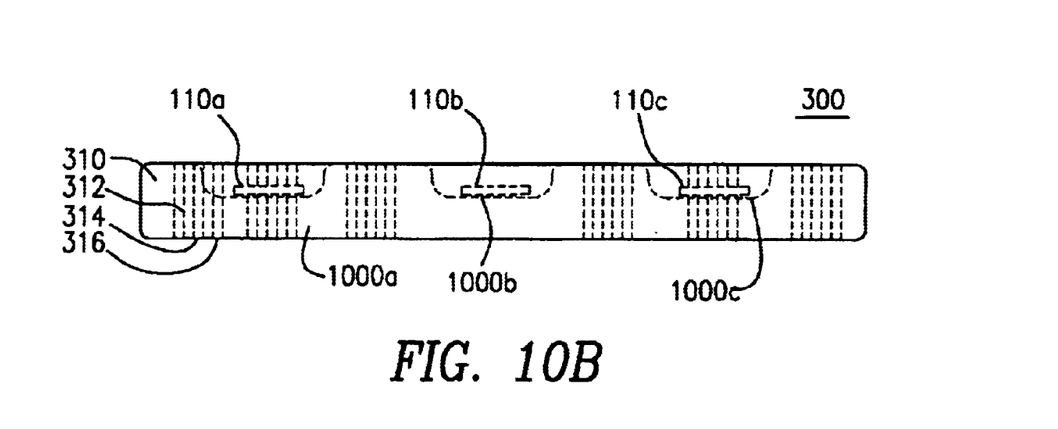

FIGS. 10a and 10b illustrate another exemplary embodiment of an MEM component module in accordance with the principles of the invention. In this embodiment, wells are formed in material 305 and integrated circuit dies are placed therein. In this illustrative example, three wells 1000a, 1000b, 1000c are formed in a first surface of material 305 and at least one integrated circuit die, i.e., dies 110a, 110b and 110c, is placed in each well. Communication paths on the first surface of material 305 interconnect integrated circuit dies 110a, 110b, 110c to each other or to via holes 310, 312, etc. Wells 1000a, 1000b, and 1000c can further be filled with a non-conductive material to protect the contained integrated dies from environmental effects, such as moisture. Furtherstill, cavities (not shown), similar to those described in regard to FIGS. 3a–3d may be included in material 305 to accommodate any protrusions on a surface caused by the associated integrated circuit dies and covering materials.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention as hereinafter claimed. It is intended that the patent shall cover by suitable expression in the appended claims, those features of patentable novelty that exists in the invention disclosed.

What is claimed is:

1. A method for fabricating electro-mechanical structures comprising a plurality of modules, each of said modules having a plurality of via holes therein, said via holes traversing from a module first surface through to a second surface and positioned in at least one substantially same location within each of said plurality of modules, said method comprising the steps of:

arranging said plurality of modules in a stacked fashion, wherein selective via holes in adjoining modules are flushly engaged to provide at least one communication path between at least one first module and at least one disposed module through via holes of intervening modules, said arranging further comprising associating at least one integrated circuit die with at least one of said plurality of modules;

placing said at least one integrated circuit die within at least one well created in said first surface;

covering said at least one well such that said covering and said first surface are substantially flush;

creating a cavity in said second surface in opposition to each of said placed integrated circuit dies, wherein said cavity is sized substantially equal to a corresponding covering.

2. The method as recited in claim 1 wherein said via holes are plated or filled with conductive material.

3. The method as recited in claim 2 wherein said conductive material is selected from a group comprising: a metal, semiconductor, conductive gel, and conductive epoxy.

4. The method as recited in claim 1 wherein each of said modules has a length greater than a width.

5. The method as recited in claim 1 wherein each of said modules is selected from a group comprising: rectangular, square, triangular, circular packaging shapes.

6. A method for fabricating electro-mechanical structures comprising a plurality of modules, each of said modules having a plurality of via holes therein, said via holes traversing from a module first surface through to a second surface and positioned in at least one substantially same location within each of said plurality of modules, said method comprising the steps of:
arranging said plurality of modules in a stacked fashion, wherein selective via holes in adjoining modules are flushly engaged to provide at least one communication path between at least one first module and at least one disposed module through via holes of intervening modules, said arranging further comprising:
organizing at least one module as a module layer;
orienting each module layer with respect to each of at least one vertically disposed adjoining module layer wherein said module layers are one of alternately oriented orthogonally to each of at least one vertically disposed adjoining layer and oriented in parallel.

7. The method as recited in claim 6 wherein said module layers are alternately oriented orthogonally to each of at least one vertically disposed adjoining layer.

8. The method as recited in claim 6 wherein each module layer is composed of two modules in parallel.

9. A micro electro-mechanical system formed of a plurality of modules, each of said modules having a plurality of via holes therein, said via holes traversing from a module first surface through to a second surface and positioned in at least one substantially same location within each of said plurality of modules, said system further comprising:
a stack of said plurality of modules wherein selective via holes in adjoining modules are in electrical contact and said selective via holes provide at least one communication path between at least one first module and at least one disposed module through via holes of intervening modules wherein at least one of said component modules is associated with at least one integrated circuit die, said associated at least one integrated circuit die residing on said module first surface; and said at least one well is covered such that said covering and said first surface are substantially flush; and wherein a cavity exists in said module second surface in opposition to each of said at least one integrated circuit dies, said cavity being sized substantially equal to a corresponding integrated circuit die.

10. The system as recited in claim 9 wherein said via holes are filled with conductive material.

11. The system as recited in claim 10 wherein said conductive material is selected from a group comprising: conductive metal, semiconductor, conductive paste and a conductive gel.

12. The system as recited in claim 9 wherein said via holes are plated with a conductive material.

13. The system as recited in claim 12 wherein said conductive material is selected from a group of comprising: conductive metal, semiconductor, conductive paste and a conductive gel.

14. The system as recited in claim 9 wherein each of said modules has a length greater than a width.

15. The system as recited in claim 9 wherein each of said modules is selected from a group comprising: rectangular, square, triangular, circular packaging shapes.

16. A micro electro-mechanical system formed of a plurality of modules, each of said modules having a plurality of via holes therein, said via holes traversing from a module first surface through to a second surface and positioned in at least one substantially same location within each of said plurality of modules, said system further comprising:
a stack of said plurality of modules wherein selective via holes in adjoining modules are in electrical contact and said selective via holes provide at least one communication path between at least one first module and at least one disposed module through via holes of intervening modules, wherein each of said modules is oriented with respect to each of at least one vertically disposed adjoining module layer in a known direction, said known direction of said adjoining module layers being one of an orthogonal and parallel orientation.

17. The system as recited in claim 16 wherein said known direction is orthogonal.

18. The system as recited in claim 16 wherein each module layer is composed of two modules in parallel.

19. A micro electro-mechanical component module of a material having a first surface and a second surface comprising:
a plurality of via holes traversing said material from said first surface through to said second surface;
at least one integrated circuit die associated with said first surface;
a cavity in said second surface in opposition to each of said at least one integrated circuit dies, wherein said cavity is sized substantially equal to a corresponding integrated circuit die wherein said at least one integrated circuit die is attached to said first surface, and placed within at least one well within said first surface.

20. The component as recited in claim 19 wherein said via holes are filled with a conductive material.

21. The module as recited in claim 20 wherein said conductive material is selected from a group comprising: a conductive material, semiconductor, conductive paste and a conductive gel.

22. The module as recited in claim 20 wherein said via holes are plated with a conductive material.

23. The module as recited in claim wherein said conductive material is selected from a group comprising: conductive metal, semiconductor, conductive paste and a conductive gel.

24. The module as recited in claim 22 wherein said material has a length greater than a width.

25. The module as recited in claim wherein said material dimensional shape is selected from a group comprising: rectangular, square, triangular, circular shapes.

26. The module as recited in claim 19 wherein said material further includes a slot traversing from said first surface to said second surface.

27. The module as recited in claim 19 wherein said at least one associated integrated circuit die is in communication with selected via holes along at least one communication path on said first surface.

28. The module as recited in claim wherein communication paths on said first surface provide communication paths between said at least one associated integrated circuit dies.

29. The module as recited in claim 19 wherein said via holes include electrical contact engagement means on said first surface.

30. The module as recited in claim 29 wherein said via holes include electrical contact engagement means on said second surface.

31. The module as recited in claim 19 wherein said via holes include electrical contact engagement means on said second surface.

* * * * *

UNITED STATES PATENT AND TRADEMARK OFFICE
CERTIFICATE OF CORRECTION

PATENT NO. : 6,780,672 B2 Page 1 of 1
APPLICATION NO. : 10/182422
DATED : August 24, 2004
INVENTOR(S) : Daniel Steele

It is certified that error appears in the above-identified patent and that said Letters Patent is hereby corrected as shown below:

Title page, item [54] and Col. 1
In the title,
MICRO ELETRO-MECHANICAL COMPONENT AND SYSTEM ARCHITECTURE, the word "ELETRO", should be "ELECTRO", making the correct title to be:

MICRO ELECTRO-MECHANICAL COMPONENT AND SYSTEM ARCHITECTURE

Signed and Sealed this

Eighteenth Day of November, 2008

JON W. DUDAS
*Director of the United States Patent and Trademark Office*